(12) United States Patent
Nobuta et al.

(10) Patent No.: US 8,279,582 B2
(45) Date of Patent: Oct. 2, 2012

(54) CONDUCTIVE POLYMER SUSPENSION AND METHOD FOR PRODUCING THE SAME, CONDUCTIVE POLYMER MATERIAL, ELECTROLYTIC CAPACITOR, AND SOLID ELECTROLYTIC CAPACITOR AND METHOD FOR PRODUCING THE SAME

(75) Inventors: Tomoki Nobuta, Miyagi (JP); Ryuta Kobayakawa, Miyagi (JP); Naoki Takahashi, Miyagi (JP); Yasuhisa Sugawara, Miyagi (JP); Satoshi Suzuki, Miyagi (JP); Toshihiko Nishiyama, Miyagi (JP)

(73) Assignee: NEC Tokin Corporation, Sendai-Shi (JP)

( * ) Notice: Subject to any disclaimer, the term of this patent is extended or adjusted under 35 U.S.C. 154(b) by 529 days.

(21) Appl. No.: 12/510,531

(22) Filed: Jul. 28, 2009

(65) Prior Publication Data

US 2010/0033906 A1    Feb. 11, 2010

(30) Foreign Application Priority Data

Aug. 5, 2008    (JP) ................... 2008-202132

(51) Int. Cl.
*H01G 9/025*    (2006.01)
*H01G 9/045*    (2006.01)

(52) U.S. Cl. ........ 361/525; 361/502; 361/524; 361/529; 528/294; 528/422; 438/46; 438/99; 428/690; 427/80; 257/40; 257/88; 257/103; 257/E51.027; 257/E51.028; 257/E51.029; 257/E51.036

(58) Field of Classification Search ............... 361/502, 361/524, 525, 529; 528/294, 422; 438/46, 438/99; 428/690; 427/80; 257/40, 88, 103, 257/E51.027, E51.028, E51.029, E51.036
See application file for complete search history.

(56) References Cited

U.S. PATENT DOCUMENTS

| 7,815,759 B1 * | 10/2010 | Fallis et al. ..................... 149/39 |
| 2006/0205860 A1 * | 9/2006 | Robeson et al. ............... 524/502 |
| 2008/0139742 A1 * | 6/2008 | Kamakura et al. ............ 524/609 |

FOREIGN PATENT DOCUMENTS

| CN | 1488671 A | 4/2004 |
| EP | 1 384 739 A1 | 1/2004 |
| EP | 1 928 004 A1 | 6/2008 |
| JP | 05-262981 | 10/1993 |
| JP | 7-90060 A | 4/1995 |

(Continued)

OTHER PUBLICATIONS

European Search Report of counterpart European Patent Application No. 09166978.8-2102. European Search Report for counterpart European Application No. EP 09 16 6978 issued on Dec. 16, 2009.

(Continued)

*Primary Examiner* — Dao H Nguyen
(74) *Attorney, Agent, or Firm* — Knobbe Martens Olson & Bear LLP

(57) ABSTRACT

The present invention provides a conductive polymer suspension for providing a conductive polymer material having a high conductivity and a method for producing the same, and in particular, a solid electrolytic capacitor having a low ESR and a method for producing the same. The conductive polymer suspension can be is produced by: synthesizing a conductive polymer by chemical oxidative polymerization of a monomer giving the conductive polymer by using an oxidant in an aqueous solvent containing a dopant consisting of a low-molecular organic acid or a salt thereof, or a polyacid having a weight average molecular weight of less than 2,000 or a salt thereof.

36 Claims, 2 Drawing Sheets

FOREIGN PATENT DOCUMENTS

| | | |
|---|---|---|
| JP | 2004-59666 A1 | 2/2004 |
| KR | 20030082059 A | 10/2003 |
| KR | 100765840 B1 | 10/2007 |
| WO | WO 99/19883 A1 | 4/1999 |
| WO | 2005/100464 A1 | 10/2005 |

OTHER PUBLICATIONS

May 9, 2011 Office Action from the Korean Patent Office for Korean Counterpart Application, Partial Translation.

Mar. 2, 2011 Office Action from the Chinese Patent Office for Chinese Counterpart Application, Partial Translation.

* cited by examiner

CONDUCTIVE POLYMER SUSPENSION AND METHOD FOR PRODUCING THE SAME, CONDUCTIVE POLYMER MATERIAL, ELECTROLYTIC CAPACITOR, AND SOLID ELECTROLYTIC CAPACITOR AND METHOD FOR PRODUCING THE SAME

BACKGROUND OF THE INVENTION

1. Field of the Invention

The present invention relates to a conductive polymer suspension and a method for producing the same, a conductive polymer material, an electrolytic capacitor, and a solid electrolytic capacitor and a method for producing the same.

2. Description of the Related Art

Conductive organic materials are used for electrodes of capacitors, electrodes of dye-sensitized solar cells and electrodes of electroluminescence displays and the like. As such conductive organic materials, those conductive polymers obtained by polymerizing pyrrole, thiophene, aniline and the like are known.

Such conductive polymers are generally supplied as a dispersion (suspension) or a solution in an aqueous solvent or as a solution in an organic solvent, which is used as a conductive polymer material by removing the solvent at the time of use. However, even when the types of the conductive polymers are the same, the physical properties of the obtained conductive polymer materials are different from each other depending on the conditions of the dispersions; and hence the methods for producing such dispersions have hitherto been studied in various manners.

Japanese Patent Application Laid-Open No. 07-90060 discloses a solution (dispersion) of polythiophene and a method for producing the solution, and a technique of application of the solution (dispersion) to an antistatic treatment of a plastic molded article. The dispersion of polythiophene includes, as the dispersion medium, water or a mixture of a water-miscible organic solvent with water, a polythiophene formed of a structural unit of 3,4-dialkoxythiophene and a polyanion derived from polystyrenesulfonic acid having a molecular weight within a range from 2,000 to 500,000. The polythiophene is obtained by chemical oxidative polymerization, in the presence of the polyanion, of polystyrenesulfonic acid having a molecular weight within a range from 2,000 to 500,000. It is described that a transparent antistatic film can be formed in this manner.

Japanese Patent Application Laid-Open No. 2004-59666 discloses a water dispersion of a complex between poly(3,4-dialkoxythiophene) and a polyanion and a method for producing the water dispersion, and a technique related to a coating composition containing the water dispersion and a coated substrate having a transparent conductive film formed by applying the composition. The water dispersion is obtained by polymerizing 3,4-dialkoxythiophene in an aqueous solvent by using peroxodisulfuric acid as an oxidant in the presence of a polyanion. Alternatively, the water dispersion is obtained by chemical oxidative polymerization of 3,4-dialkoxythiophene in an aqueous solvent by using an oxidant in the presence of a polyanion under the pH of the reaction solution lowered by adding an acid selected from the group consisting of water-soluble inorganic acids and organic acids. It is described that a conductive thin film excellent in transparency can be formed in this manner.

However, by the methods described in Japanese Patent Application Laid-Open Nos. 07-90060 and 2004-59666, specifically by a method which conducts the chemical oxidative polymerization of 3,4-dialkoxythiophene in one stage in the presence of the polyanion acting as a dopant, it is difficult to obtain a polythiophene solution including fine particles because the molecular chain length of the polyanion is large. Further, the control of the doping rate of the polyanion is difficult. The molecular weight of the polystyrenesulfonic acid (polyanion) used in Japanese Patent Application Laid-Open Nos. 07-90060 and 2004-59666 is set at 2,000 or more, and hence the weight average molecular weight of the polystyrenesulfonic acid is naturally larger than 2,000 and in general, probably 10000 or more. The undoped polyanion, namely, the polyanion making no contribution to the conductivity comes to be present in an excessive amount, and thus, the methods are far from being satisfactory methods as the production method for obtaining a conductive polymer material having a higher conductivity.

The conductive polymer film obtained by the method described in Japanese Patent Application Laid-Open No. 7-90060 has a sufficient conductivity as an antistatic material, but hardly attains a conductivity sufficiently satisfying the requirement for lowering the ESR, for example, when used as a solid electrolyte in a capacitor. In other words, the surface resistivity of an antistatic film is generally classified to fall within a range from $10^5$ to $10^{14} \Omega/\square$; when the conductivity is too high, there is a possibility of occurrence of an intense electrostatic discharge, and hence it is understood that the antistatic film does not have a conductivity so high as to rapidly dissipate the static charge of an charged object. Therefore, a material usable as an antistatic film is high in resistance as the solid electrolyte for use in capacitors and hence cannot satisfy the requirement of low resistance. Additionally, a capacitor including a solid electrolyte that contains excessive polyanions has a drawback of poor reliability, in particular, poor properties in a high humidity atmosphere.

SUMMARY OF THE INVENTION

An object of the present invention is to solve the above-described problems, specifically, to provide a conductive polymer suspension for providing a conductive polymer material having a high conductivity and a method for producing the same, and in particular to provide a solid electrolytic capacitor having a low ESR and a method for producing the same.

A method (1) for producing a conductive polymer suspension of the present invention comprises:

synthesizing a conductive polymer (P1) by chemical oxidative polymerization of a monomer (M1) giving the conductive polymer by using an oxidant (O1) in an aqueous solvent containing a dopant (D1) consisting of a low-molecular organic acid or a salt thereof, or a polyacid having a weight average molecular weight of less than 2,000 or a salt thereof.

A method (2) for producing a conductive polymer suspension of the present invention comprises:

(a) synthesizing the conductive polymer (P2) by chemical oxidative polymerization of a monomer (M2) giving the conductive polymer by using an oxidant (O2) in a solvent containing a dopant (D2) consisting of a low-molecular organic acid or a salt thereof;

(b) purifying the conductive polymer (P2); and (c) mixing the purified conductive polymer (P2) and an oxidant (O3) in an aqueous solvent containing a polyacid component consisting of a low-molecular organic acid or a salt thereof, or a polyacid having a weight average molecular weight of less than 2,000 or a salt thereof, to obtain the conductive polymer suspension.

A conductive polymer suspension of the present invention is obtained by the above-described method. A conductive polymer material of the present invention is obtained by removing the solvent from the above-described conductive polymer suspension.

An electrolytic capacitor of the present invention comprises, as an electrolyte, the above-described conductive polymer suspension. A solid electrolytic capacitor of the present invention comprises a solid electrolyte layer including the above-described conductive polymer material.

A first method for producing a solid electrolytic capacitor of the present invention comprises:

forming a dielectric layer on the surface of an anode conductor consisting of a valve action metal; and forming a solid electrolyte layer comprising the conductive polymer material by applying or impregnating the above-described conductive polymer suspension onto the dielectric layer and by removing the solvent from the conductive polymer suspension.

A second method for producing a solid electrolytic capacitor of the present invention, comprises:

forming a dielectric layer on the surface of an anode conductor consisting of a valve action metal;

forming a first solid electrolyte layer comprising a conductive polymer (P3) by chemical oxidative polymerization or electrolytic polymerization of a monomer (M3) giving the conductive polymer on the dielectric layer; and forming a second solid electrolyte layer by applying or impregnating the above-described conductive polymer suspension onto the first solid electrolyte layer and by removing the solvent from the conductive polymer suspension.

The present invention can provide a conductive polymer suspension for proving a conductive polymer material having a high conductivity and a method for producing the same, and in particular, a solid electrolytic capacitor having a low ESR and a method for producing the same.

DETAILED DESCRIPTION OF THE PREFERRED EMBODIMENTS

Figure 1:
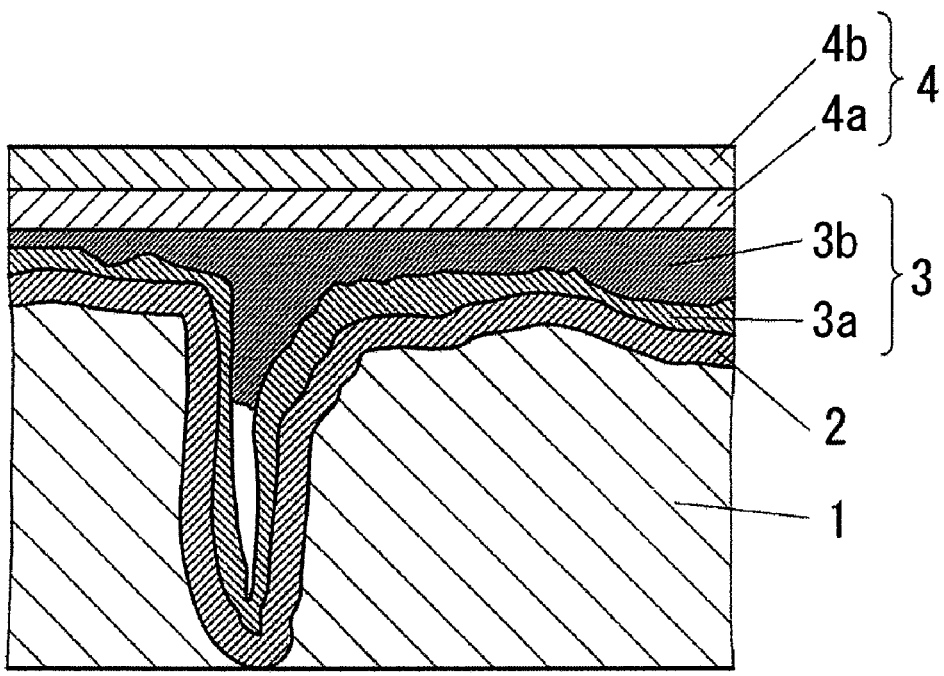
FIG. 1 is a schematic sectional view illustrating the structure of the solid electrolytic capacitor according to an embodiment of the present invention.

The method (1) for producing a conductive polymer suspension of the present invention is described.

In the method (1) for producing a conductive polymer suspension, the conductive polymer (P1) is synthesized by chemical oxidative polymerization of a monomer (M1) giving the conductive polymer by using an oxidant (O1) in an aqueous solvent containing a dopant (D1) consisting of a low-molecular organic acid or a salt thereof, or a polyacid having a weight average molecular weight of less than 2,000 or a salt thereof. This step enables to obtain a conductive polymer suspension for providing a conductive polymer material having a high conductivity.

As the aqueous solvent, water is preferable but a mixed solvent composed of water and a water-soluble organic solvent may also be adopted. Specific examples of the water-soluble organic solvent include: protic polar solvents such as methanol, ethanol, propanol and acetic acid; and aprotic polar solvents such as N,N-dimethylformamide, dimethyl sulfoxide, acetonitrile and acetone.

The monomer (M1) can be appropriately selected from the monomers giving conductive polymers. Specific examples of the monomer (M1) include pyrrole, thiophene, aniline and derivatives of these. Specific examples of the pyrrole derivatives include: 3-alkylpyrroles such as 3-hexylpyrrole; 3,4-dialkylpyrroles such as 3,4-dihexylpyrrole; 3-alkoxypyrroles such as 3-methoxypyrrole; and 3,4-dialkoxypyrroles such as 3,4-dimethoxypyrrole. Specific examples of the thiophene derivatives include: 3,4-ethylenedioxythiophene and derivatives thereof; 3-alkylthiophene such as 3-hexylthiophene; and 3-alkoxythiophenes such as 3-methoxythiophene. Specific examples of the aniline derivatives include: 2-alkylanilines such as 2-methylaniline; and 2-alkoxyanilines such as 2-methoxyaniline. Among these, 3,4-ethylenedioxythiophene represented by the following formula (1) or derivatives thereof are preferable. Specific examples of the derivatives of 3,4-ethylenedioxythiophene include 3,4-(1-alkyl)ethylenedioxythiophene such as 3,4-(1-hexyl)ethylenedioxythiophene. The monomer (M1) may be used alone or in combinations of two or more thereof.

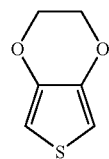

(1)

For the purpose of obtaining the conductive polymer (P1) having a high conductivity, the concentration of the monomer (M1) in the solvent is preferably 0.1 to 30% by weight and more preferably 0.5 to 10% by weight.

As the dopant (D1), a low-molecular organic acid or a salt thereof, or a polyacid having a weight average molecular weight of less than 2,000 or a salt thereof is used. The use of such a dopant (D1) having a small molecular weight enables to obtain a suspension in which the particle size of the dispersed particles is small. The conductive polymer material obtained by removing the solvent from the suspension in which the particle size of the dispersed particles is small has a high density and consequently comes to have a high conductivity. The suspension in which the particle size of the dispersed particles is small easily penetrates into the pores of the porous body used for the electrode of a capacitor, and hence the contact portion between the suspension and the solid electrolyte layer in the interior of the pores is increased to contribute to the resistance reduction.

Specific examples of the low-molecular organic acid and a salt thereof to be the dopant (D1) include alkylsulfonic acids, benzenesulfonic acid, naphthalenesulfonic acid, anthraquinonesulfonic acid, camphorsulfonic acid and derivatives of these, and the iron(III) salts of these. The low-molecular organic acid may be a monosulfonic acid, a disulfonic acid or a trisulfonic acid. Specific examples of the derivatives of the alkylsulfonic acids include 2-acrylamide-2-methylpropanesulfonic acid. Specific examples of the derivatives of benzenesulfonic acid include phenolsulfonic acid, styrenesulfonic acid, toluenesulfonic acid and dodecylbenzenesulfonic acid. Specific examples of the derivatives of naphthalenesulfonic acid include 1-naphthalenesulfonic acid, 2-naphthalenesulfonic acid, 1,3-naphthalenedisulfonic acid, 1,3,6-naphthalenetrisulfonic acid and 6-ethyl-1-naphthalenesulfonic acid. Specific examples of the derivatives of anthraquinonesulfonic acid include anthraquinone-1-sulfonic acid, anthraquinone-2-sulfonic acid, anthraquinone-2,6-disulfonic acid and 2-methylanthraquinone-6-sulfonic acid. Among these, 1-naphthalenesulfonic acid, 2-naphthalenesulfonic acid, 1,3,6-naphthalenetrisulfonic acid, anthraquinonedisulfonic acid, p-toluenesulfonic acid, camphorsulfonic acid and the iron(III) salts of these are preferable. Because of a marked effect on the high crystallization of the polymer, camphorsulfonic acid is more preferable. Camphorsulfonic acid may also be an optically active substance.

Specific examples of the polyacid to be the dopant (D1) include: polycarboxylic acids such as polyacrylic acid, polymethacrylic acid and polymaleic acid; polysulfonic acids such as polyvinylsulfonic acid, poly(2-acrylamido-2-methylpropanesulfonic acid) and polystyrenesulfonic acid; and copolymers having these structural units. Specific examples of the salts of the polyacids include lithium salts, sodium salts, potassium salts and ammonium salts of polyacids. Among these, polystyrenesulfonic acid having the structural unit represented by the following formula (3) is preferable.

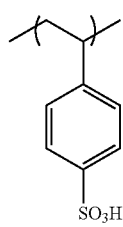

(3)

For the viewpoint of obtaining a suspension in which the particle size of the dispersed particles is small, the weight average molecular weight of the polyacid or the salt thereof is set at less than 2,000 and is preferably 1,800 or less. The polyacid or the salt thereof has only to be the dimer or higher multimer of the monomer constituting the polyacid or the salt thereof.

The dopant (D1) may be used alone or in combinations of two or more thereof.

The use of the dopant (D1) in an excessive amount sometimes impairs the conductivity, and hence the amount of the dopant (D1) used is preferably 0.1 to 50 parts by weight and more preferably 0.2 to 20 parts by weight, in relation to 1 part by weight of the monomer (M1).

The oxidant (O1) is not particularly limited. Examples of the usable oxidant (O1) include: iron(III) salts of inorganic acids such as iron(III) chloride hexahydrate, anhydrous iron (III) chloride, iron(III) nitrate nonahydrate, anhydrous ferric nitrate, iron(III) sulfate n-hydrate (n=3 to 12), ammonium iron(III) sulfate dodecahydrate, iron(III) perchlorate n-hydrate (n=1,6) and iron(III) tetrafluoroborate; copper(II) salts of inorganic acids such as copper(II) chloride, copper(II) sulfate and copper(II) tetrafluoroborate; nitrosonium tetrafluoroborate; persulfates such as ammonium persulfate, sodium persulfate and potassium persulfate; periodates such as potassium periodate; hydrogen peroxide, ozone, potassium hexacyanoferrate(III), tetraammonium cerium(IV) sulfate dihydrate, bromine and iodine; and iron(III) salts of organic acids such as iron(III) p-toluenesulfonate. Among these, iron (III) salts of inorganic acids or organic acids, or persulfates are preferable, and ammonium persulfate or iron(III) p-toluenesulfonate is more preferable. The oxidant (O1) may be used alone or in combinations of two or more thereof.

For the purpose of obtaining the conductive polymer (P1) having a high conductivity, the amount of the oxidant (O1) used is preferably 0.5 to 100 parts by weight and more preferably 1 to 30 parts by weight, in relation to 1 part by weight of the monomer (M1).

The chemical oxidative polymerization can also be conducted in the presence of a surfactant. The solubility of the monomer (M1) in water is low. Accordingly, when water is used as the solvent, the use of a surfactant enables to improve the dispersibility of the monomer (M1). The surfactant may be an anionic surfactant, a cationic surfactant, an amphoteric surfactant or a nonionic surfactant. Dodecylbenzenesulfonic acid or polyethylene glycol is preferable. The surfactant may be used alone or in combinations of two or more thereof.

For the purpose of obtaining the conductive polymer (P1) having a high conductivity, the amount of the surfactant used is preferably 0.01 to 10 parts by weight and more preferably 0.1 to 5 parts by weight, in relation to 1 part by weight of the monomer (M1).

It is preferable to further include a step of mixing at least one selected from erythritol and pentaerythritol during or after the chemical oxidative polymerization. The chemical oxidative polymerization in the presence of erythritol or pentaerythritol allows erythritol or pentaerythritol to interact with the acid component (undoped dopant anion (resistive component)) which is located in the vicinity of the conductive polymer (P1) in the conductive polymer suspension. The interaction reduces the resistance between the conductive polymer (P1) particles and at the same time increases the density of the conductive polymer (P1), and hence the conductive polymer (P1) is enabled to have a further higher conductivity.

Erythritol is higher in crystallinity than the polyhydric alcohols such as sorbitol and maltitol and accordingly low in hygroscopicity and hence is preferable from the viewpoint of easiness in handling. Erythritol is also known as a food additive used as a sweetener, is excellent in safety and stability, and is several-fold higher in solubility in water than in non-aqueous solvents such as ethylene glycol and glycerin, and hence erythritol provides an advantage in the degree of freedom in designing the addition amount thereof.

Pentaerythritol is characterized by being slowly sublimed when heated, and by undergoing dehydration and polymerization when heated at a temperature equal to or higher than the melting point thereof. Thus, pentaerythritol has an advantage that the physical properties of an organic material are accordingly altered to improve the density and the strength thereof. Such reactivity originates from the chemical structure of pentaerythritol, and hardly results from such chemical structure as that of erythritol or sorbitol.

The mixing of erythritol or pentaerythritol in a concentration equal to or higher than the concentration of the conductive polymer (P1) in the conductive polymer suspension attains a more marked effect. It is to be noted that the upper limit of the mixing amount is not particularly limited as long as it is dissolved completely in the conductive polymer suspension.

The conductive polymer (P1) obtained by chemical oxidative polymerization of the monomer (M1) has the structural unit derived from the monomer (M1). For example, when 3,4-ethylenedioxythiophene represented by the formula (1) is used as the monomer (M1), the obtained conductive polymer (P1) has the structural unit represented by the following formula (2).

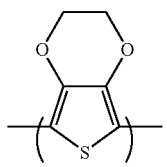

(2)

It is preferable to conduct the chemical oxidative polymerization under stirring. The reaction temperature of the chemical oxidative polymerization is not particularly limited; however, the chemical oxidative polymerization is conducted with the upper limit of the reaction temperature set at the reflux temperature of the solvent used, and the reaction temperature is preferably 0 to 100° C. and more preferably 10 to 50° C. When the reaction temperature is inappropriate, the conductivity of the obtained conductive polymer (P1) is sometimes degraded. The reaction time of the chemical oxidative polymerization depends on the type and the amount of the oxidant (O1) used, the reaction temperature, the stirring conditions and the like; the reaction time is preferably about 5 to 100 hours.

The ion exchange treatment by using an ion exchange resin is also effective as a method for removing the isolated ion component derived from the oxidant.

A resin that functions as binding action may be added to the obtained conductive polymer suspension. Specific examples of the resin include polyester resin, polyamide resin, polyimide resin, polyether resin and polystyrene resin. From the viewpoint of not impairing the conductivity, the amount of the resin added is preferably 0.01 to 20 parts by weight in relation to 100 parts by weight of the conductive polymer suspension.

The conductive polymer suspension obtained by the above-described method (1) for producing a conductive polymer suspension usually shows deep blue color.

The method (2) for producing a conductive polymer suspension of the present invention is described.

In the method (2) for producing a conductive polymer suspension, a conductive polymer (P2) is first synthesized by chemical oxidative polymerization of a monomer (M2) giving the conductive polymer by using an oxidant (O2) in a solvent containing a dopant (D2) consisting of a low-molecular organic acid or a salt thereof (step (a)). The step (a) enables to obtain the conductive polymer (P2) having a high degree of polymerization and a high degree of crystallization.

The solvent in which the reaction is conducted is preferably selected as a solvent satisfactory in the compatibility with the monomer (M2). The solvent may be water, an organic solvent or a water-mixed organic solvent. Specific examples of the organic solvent include: alcohol solvents such as methanol, ethanol and propanol; aromatic hydrocarbon solvents such as benzene, toluene and xylene; and aliphatic hydrocarbon solvents such as hexane. The organic solvent may be used alone or in combinations of two or more thereof. Among these, ethanol or a mixed solvent composed of ethanol and water is preferable.

As the monomer (M2), the same monomer as used in the method (1) for producing a conductive polymer suspension can be used. The concentration of the monomer (M2) in the solvent is not particularly limited because the monomer (M2) can be removed in the step (b) even when the concentration is excessive. However, For the purpose of obtaining the conductive polymer (P2) having a high conductivity in a satisfactory yield, the concentration of the monomer (M2) is preferably 0.5 to 70% by weight and more preferably 1 to 50% by weight.

As the dopant (D2), a low-molecular organic acid or a salt thereof is used. As the low-molecular organic acid or the slat thereof, the same low-molecular organic acid or the same salt thereof as used as the dopant (D1) in the method (1) for producing a conductive polymer suspension can be used. Additionally, iron(III) p-toluenesulfonate is also preferable as the dopant (D2) because it also functions as the oxidant (O2). The amount of the dopant (D2) used is not particularly limited because the dopant (D2) can be removed in the step (b) even when it is added in an excessive amount. However, for the purpose of obtaining the conductive polymer (P2) having a high conductivity, the amount of the dopant (D2) used is preferably 1 to 100 parts by weight and more preferably 1 to 20 parts by weight, in relation to 1 part by weight of the monomer (M2).

As the oxidant (O2), the same oxidant as the oxidant (O1) used in the method (1) for producing a conductive polymer suspension can be used. In particular, iron(III) p-toluenesulfonate is more preferable as the oxidant (O2) because it also functions as the organic acid dopant (D2). The amount of the oxidant (O2) used is not particularly limited because the oxidant (O2) can be removed in the step (b) even when it is added in an excessive amount. However, for the purpose of obtaining the polymer having a high conductivity by allowing the reaction to occur in a more moderate oxidative atmosphere, the amount of the oxidant (O2) used is preferably 0.5 to 100 parts by weight and more preferably 1 to 40 parts by weight, in relation to 1 part by weight of the monomer (M2).

The step (a) can also be conducted in the presence of a surfactant. As the surfactant, the same surfactant as the surfactant used in the method (1) for producing a conductive polymer suspension can be used. The amount of the surfactant used is not particularly limited because the surfactant can be removed in the step (b) even when it is added in an excessive amount. However, the amount of the surfactant used is preferably 0.01 to 10 parts by weight and more preferably 0.1 to 5 parts by weight, in relation to 1 part by weight of the monomer (M2).

The conductive polymer (P2) obtained by chemical oxidative polymerization of the monomer (M2) has the structural unit derived from the monomer (M2).

It is preferable to conduct the chemical oxidative polymerization under stirring. The reaction temperature of the chemical oxidative polymerization is not particularly limited; however, the chemical oxidative polymerization is conducted with the upper limit of the reaction temperature set at the reflux temperature of the solvent used, and the reaction temperature is preferably 0 to 100° C. and more preferably 10 to 50° C. When the reaction temperature is inappropriate, the conductivity of the obtained conductive polymer (P2) is sometimes degraded. The reaction time of the chemical oxidative polymerization depends on the type and the amount of the oxidant (O2) used, the reaction temperature, the stirring conditions and the like; the reaction time is preferably about 5 to 100 hours. It is to be noted that when the conductive polymer (P2) has been produced, the reaction solution turns deep blue.

In the method (2) for producing a conductive polymer suspension, the conductive polymer (P2) is next purified (step (b)). Specifically, from the reaction solution containing the conductive polymer (P2) having been obtained by chemical oxidative polymerization, the conductive polymer (P2) is separated and washed to remove the dopant (D2), the monomer (M2), the oxidant (O2) and the oxidant after having undergone the reaction. The step (b) enables to obtain the conductive polymer (P2) having a high purity.

Examples of the method for separating the conductive polymer (P2) from the reaction solution include a filtration method and a centrifugal separation method.

The washing with a solvent is preferably conducted by using a solvent capable of dissolving the monomer (M2) and/or the oxidant (O2) without dissolving the conductive polymer (P2). Specific examples of the washing solvent include water and alcohol solvents such as methanol, ethanol and propanol. The washing solvent may be used alone or in combinations of two or more thereof. The extent of the washing can be checked by pH measurement or calorimetric observation of the washing solvent having been used for washing.

Further, it is preferable that the conductive polymer (P2) is washed with hot water and/or heat treated because the metal component derived from the oxidant (O2) can be removed to a higher extent. The heat treatment temperature is not particularly limited as long as it is equal to or lower than the decomposition temperature of the conductive polymer (P2); the heat treatment is preferably conducted at a temperature lower than 300° C. An ion exchange treatment conducted with an ion exchange resin is also effective as a method for removing the metal component derived from the oxidant.

The impurities contained in the conductive polymer (P2) can be quantitatively determined by ICP luminescence analysis, ion chromatography or the like.

In the method (2) for producing a conductive polymer suspension, the purified conductive polymer (P2) and the oxidant (O3) are next mixed in an aqueous solvent containing an acid component including a low-molecular organic acid or a salt thereof, or a polyacid having a weight average molecular weight of less than 2,000 or a salt thereof, to obtain the conductive polymer suspension (step (c)). The use of such an acid component having a small molecular weight enables to obtain a suspension in which the particle size of the dispersed particles is small. The conductive polymer material obtained by removing the solvent from the suspension in which the particle size of the dispersed particles is small has a high density and consequently comes to have a high conductivity. The suspension in which the particle size of the dispersed particles is small easily penetrates into the pores of the porous body used for the electrode of a capacitor, and hence the contact portion between the suspension and the solid electrolyte layer in the interior of the pores is increased to contribute to the resistance reduction.

In the step (c), the acid component also acts as a dispersant, and hence a conductive polymer suspension satisfactory in dispersion can be obtained. The dispersion mechanism probably involves at least the doping effect of the anion derived from the acid component.

As the aqueous solvent, the same aqueous solvent as used in the method (1) for producing a conductive polymer suspension can be used.

The concentration of the conductive polymer (P2) in the aqueous solvent is preferably 0.1 to 20% by weight and more preferably 0.5 to 10% by weight.

As the acid component, a low-molecular organic acid or a salt thereof, or a polyacid having a weight average molecular weight of less than 2,000 or a salt thereof can be used, and the same component as the dopant (D1) used in the method (1) for producing a conductive polymer suspension can be used. The amount of the acid component used is preferably 20 to 3,000 parts by weight and more preferably 30 to 1,000 parts by weight, in relation to 100 parts by weight of the conductive polymer (P2).

As the oxidant (O3), the same oxidant as the oxidant (O1) used in the method (1) for producing a conductive polymer suspension can be used. Among them, ammonium persulfate, hydrogen peroxide or the like is preferable. For the purpose of obtaining the conductive polymer (P2) having a high conductivity, the used amount of the oxidant (O3) is preferably 0.5 to 50 parts by weight and more preferably 1 to 30 parts by weight, in relation to 1 part by weight of the conductive polymer (P2).

The temperature of the step (c) is not particularly limited; however, it is preferably within a range from 0° C. to 100° C. and more preferably within a range from 10° C. to 50° C. The time of the step (c) is not particularly limited; however, it is about 5 to 100 hours.

It is preferable to apply the above-described ion exchange treatment after the step (c).

It is preferable to further include a step (step (d)) of mixing at least one selected from erythritol and pentaerythritol during or after the step (c) in the same manner as in the method (1) for producing a conductive polymer suspension. The step (d) allows erythritol or pentaerythritol to interact with the acid component (undoped dopant anion (resistive component)) which is located in the vicinity of the conductive polymer (P2) in the conductive polymer suspension. The interaction reduces the resistance between the conductive polymer (P2) particles and at the same time increases the density of the conductive polymer (P2), and hence the conductive polymer (P2) is enabled to have a further higher conductivity.

The mixing of erythritol or pentaerythritol in a concentration equal to or higher than the concentration of the conductive polymer (P2) in the conductive polymer suspension attains a more marked effect. It is to be noted that the upper limit of the mixing amount is not particularly limited as long as it is dissolved completely in the conductive polymer suspension.

A resin that functions as binding action may be added as another additive to the obtained conductive polymer suspension in the same manner as in the method (1) for producing a conductive polymer suspension. From the viewpoint of not impairing the conductivity, the amount of the resin added is preferably 0.01 to 20 parts by weight in relation to 100 parts by weight of the polythiophene suspension.

The conductive polymer suspension obtained by the above-described method (2) for producing a conductive polymer suspension is small in the particle size of the dispersed particles, and additionally high in the degree of polymerization, the degree of crystallization and the purity of the conductive polymer, and hence comes to have a high conductivity. The conductive polymer suspension usually shows deep blue color.

By removing the solvent from the conductive polymer suspension of the present invention, a conductive polymer material can be obtained. The conductive polymer material has a high conductivity. It is to be noted that the conductive polymer is high in the degree of crystallization and disperses light and hence the conductive polymer material has no transparency and show a color close to black.

The removal of the solvent can be conducted by drying the conductive polymer. The drying temperature is not particularly limited as long as the drying temperature is equal to or lower than the decomposition temperature of the conductive polymer; however the drying temperature is preferably 300° C. or lower.

The conductive polymer suspension of the present invention can be used as an electrolyte of an electrolytic capacitor. The conductive polymer material obtained by removing the solvent from the conductive polymer suspension of the present invention can be used as the solid electrolyte layer of a solid electrolytic capacitor. The high conductivity of the conductive polymer contained in the conductive polymer suspension or of the conductive polymer material obtained by removing the solvent from the conductive polymer suspension enables to obtain a capacitor having a low ESR. Further, the degree of crystallization of the conductive polymer is high and hence the oxygen barrier property is also correlatively high, and thus the improvement of the reliability of the capacitor is also sufficiently promising.

FIG. 1 shows a schematic sectional view illustrating the structure of the solid electrolytic capacitor according to an embodiment of the present invention. The solid electrolytic capacitor has a structure in which dielectric layer 2, solid electrolyte layer 3 and cathode conductor 4 are formed in this order on anode conductor 1.

Anode conductor 1 is formed of: a plate, a foil or a wire of a valve action metal; a sintered body made of fine particles of a valve action metal; a porous metal subjected to a surface area enlargement treatment by etching; or the like. Specific examples of the valve action metal include tantalum, aluminum, titanium, niobium and zirconium, and alloys of these. Among these, at least one valve action metal selected from aluminum, tantalum and niobium is preferable.

Dielectric layer 2 is a layer that can be formed by the electrolytic oxidation of the surface of anode conductor 1, and is also formed in the vacancy portions of a sintered body or a porous body. The thickness of dielectric layer 2 can be appropriately adjusted by the voltage of the electrolytic oxidation.

Solid electrolyte layer 3 includes at least the conductive polymer material obtained by removing the solvent from the above-described conductive polymer suspension. Examples of the method for forming solid electrolyte layer 3 include a method in which the above-described conductive polymer suspension is applied or impregnated onto dielectric layer 2, and the solvent is removed from the conductive polymer suspension.

The application or impregnation method is not particularly limited. However, for the purpose of sufficiently filling the conductive polymer suspension in the interior of the pores of the porous material, dielectric layer 2 is preferably allowed to stand for a few minutes to a few tens minutes after application or impregnation. Application or immersion can also be repeated. For the impregnation, a pressure reduction method or a pressurization method is preferable.

The removal of the solvent from the conductive polymer suspension can be conducted by drying the conductive polymer. The drying temperature is not particularly limited as long as it is within a temperature range in which the solvent removal is possible; however, from the viewpoint of the prevention of element degradation by heat, the upper limit of the drying temperature is preferably lower than 300° C. It is necessary to appropriately optimize the drying time according to the drying temperature; the drying time is not particularly limited as long as it is within a range in which the conductivity is not impaired.

Further, solid electrolyte layer 3 may also include: conductive polymers formed of pyrrole, thiophene, aniline and derivatives of these; oxide derivatives such as manganese dioxide and ruthenium oxide; and organic semiconductors such as TCNQ (7,7,8,8-tetracyanoquinodimethane complex salt).

For example, solid electrolyte layer 3 may also be designed to have a two-layer structure formed of first solid electrolyte layer 3a and second solid electrolyte layer 3b. First solid electrolyte layer 3a including a conductive polymer (P3) may be formed on dielectric layer 2 by chemical oxidative polymerization or electrolytic polymerization of a monomer (M3) giving the conductive polymer. Second solid electrolyte layer 3b is formed by applying or impregnating the above-described conductive polymer suspension onto first solid electrolyte layer 3a and by removing the solvent from the conductive polymer suspension.

As the monomer (M3), at least one selected from pyrrole, thiophene, aniline and derivatives of these can be used. As the dopant used when the conductive polymer (P3) is obtained by chemical oxidative polymerization or electrolytic polymerization of the monomer (M3), sulfonic acid compounds such as alkylsulfonic acid, benzenesulfonic acid, naphthalenesulfonic acid, anthraquinonesulfonic acid, camphorsulfonic acid and derivatives of these are preferable. With respect to the molecular weight of the dopant, dopants ranging from monomers to polymers can be used in an appropriately selected manner. The solvent may be only water or a mixed solvent composed of water and a water-soluble organic solvent.

The conductive polymer (P3) included in first solid electrolyte layer 3a and the conductive polymer (P1) or (P2) included in second solid electrolyte layer 3b are preferably the same polymer.

Cathode conductor 4 is not particularly limited as long as cathode conductor 4 is a conductor; however, cathode conductor 4 may also be designed to have a two-layer structure formed of carbon layer 4a made of graphite or the like and silver conductive resin layer 4b.

EXAMPLES

Hereinafter, the present invention is described more specifically with reference to Examples; however, the present invention is not limited only to these Examples.

Example 1

Production Method (1)

In 100 ml of water, 1 g of 3,4-ethylenedioxythiophene as the monomer (M1) and 10 g of an aqueous solution containing 20% by weight of polystyrenesulfonic acid (weight average molecular weight: 1,800) as the dopant (D1) were served and stirred for 30 minutes. Successively, to this reaction mixture, 0.5 ml of an aqueous solution containing 40% by weight of ammonium persulfate as the oxidant (O1) was added dropwise; and subsequently, the dropwise addition was conducted as six separate operations at 10-minute intervals (in total, 3 ml), and thereafter the reaction mixture was stirred at room temperature for 60 hours to conduct the chemical oxidative polymerization. In this case, the solution turned from pale yellow to deep navy blue.

Figure 2:
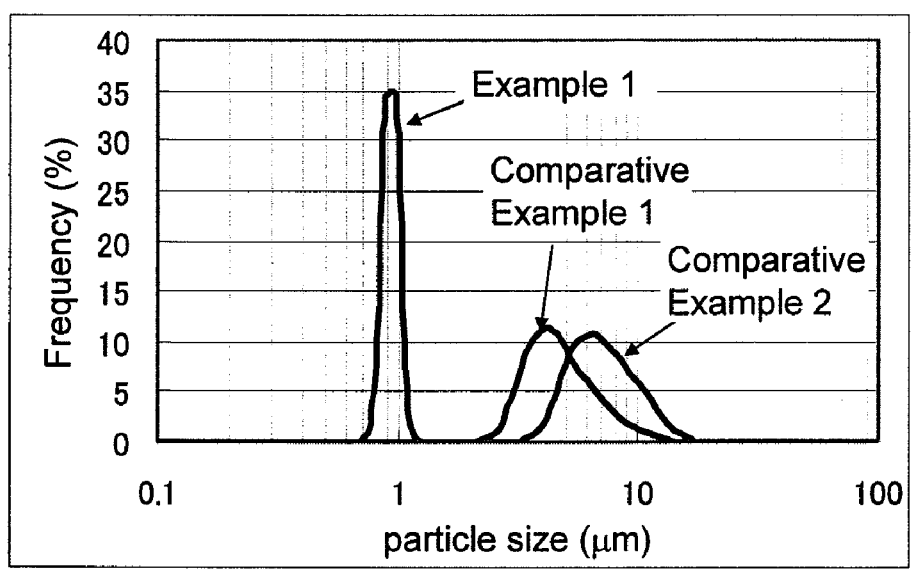
FIG. 2 is a chart showing the particle size distributions of the polythiophene suspensions produced in Example 1 and Comparative Examples 1 and 2 and FIG. 3 is a chart showing the X-ray diffractions of the conductive polymer films formed in Example 6 and Comparative Example 1.

The particle size distribution of the obtained polythiophene suspension was measured by the microtrack method. The measurement result thus obtained is shown in FIG. 2.

Next, the obtained polythiophene suspension was dropped onto a glass substrate in an amount of 100 μl, the substrate was dried in a thermostatic chamber at 125° C. for 15 minutes, and then treated at 180° C. for 30 minutes to form a conductive polymer layer. Thereafter, the surface resistance (Ω/□) and the film thickness of the conductive polymer film were measured by the four-terminal method, and the conductivity (S/cm) was derived. The result thus obtained is shown in Table 1.

Example 2

Production Method (1)

A polythiophene suspension was produced by operating in the same manner as in Example 1 except that a polystyrenesulfonic acid having a weight average molecular weight of 1,000 was used as the dopant (D1). Then, a conductive polymer film was formed in the same manner as in Example 1, and thereafter the conductivity of the conductive polymer film was derived. The result thus obtained is shown in Table 1.

Example 3

Production Method (1)

A polythiophene suspension was produced by operating in the same manner as in Example 1 except that styrenesulfonic acid was used as the dopant (D1) and the served amount thereof was set at 19 g. Then, a conductive polymer film was formed in the same manner as in Example 1, and thereafter the conductivity of the conductive polymer film was derived. The result thus obtained is shown in Table 1.

Example 4

Production Method (1)

In 100 ml of water, 1 g of 3,4-ethylenedioxythiophene as the monomer (M1), 2.3 g of dodecylbenzenesulfonic acid functioning as the dopant (D1) and a surfactant and 10 g of an aqueous solution containing 20% by weight of polystyrenesulfonic acid (weight average molecular weight: 1,800) as the dopant (D1) were dispersed and stirred at room temperature for 1 hour to be sufficiently dispersed. Thereafter, to this reaction mixture, 0.5 ml of an aqueous solution containing 40% by weight of ammonium persulfate as the oxidant (O1) was added dropwise; and subsequently, the dropwise addition was conducted as six separate operations at 10-minute intervals (in total, 3 ml), and thereafter the reaction mixture was stirred at room temperature for 60 hours to conduct the chemical oxidative polymerization. In this case, the solution turned from pale yellow to deep navy blue.

By using the obtained polythiophene suspension, a conductive polymer film was formed in the same manner as in Example 1, and thereafter the conductivity of the conductive polymer film was derived. The result thus obtained is shown in Table 1.

Example 5

Production Method (1)

In 100 ml of water, 1 g of 3,4-ethylenedioxythiophene as the monomer (M1) and 10 g of an aqueous solution containing 20% by weight of polystyrenesulfonic acid (weight average molecular weight: 1,800) as the dopant (D1) were served and stirred for 30 minutes. Successively, to this reaction mixture, 0.5 ml of an aqueous solution containing 40% by weight of ammonium persulfate as the oxidant (O1) was added dropwise; and subsequently, the dropwise addition was conducted as six separate operations at 10-minute intervals (in total, 3 ml), and thereafter the reaction mixture was stirred at room temperature for 60 hours to conduct the chemical oxidative polymerization. In this case, the solution turned from pale yellow to deep navy blue. Then, 11 g of erythritol was mixed in the reaction solution and the reaction solution was further stirred for 10 hours. In this case, the color of the solution was maintained to be deep navy blue.

By using the obtained polythiophene suspension, a conductive polymer film was formed in the same manner as in Example 1, and thereafter the conductivity of the conductive polymer film was derived. The result thus obtained is shown in Table 1.

Example 6

Production Method (2)

<Step (a)>

In 30 ml of ethanol as the solvent, 1 g of 3,4-ethylenedioxythiophene as the monomer (M2), 1 g of camphorsulfonic acid as the dopant (D2) and 9 g of iron (III) p-toluenesulfonate functioning as the oxidant (O2) and the dopant (D2) were dissolved. The obtained solution was stirred at room temperature for 24 hours to conduct the chemical oxidative polymerization. In this case, the solution turned from yellow to deep blue.

<Step (b)>

The obtained solution was filtered by using a reduced pressure filtration apparatus to collect a powder. The powder was washed with purified water to remove the excessive oxidant (O2) and dopant (D2). The washing with purified water was repeated until the acidity of the filtrate came to be pH 6 to 7. Thereafter, the powder was washed with ethanol to remove the monomer (M2), the oxidant (O2) and the oxidant (iron(II) p-toluenesulfonate) after having undergone the reaction were removed. The washing with ethanol was conducted until the filtrate came to be colorless and transparent.

<Step (c)>

In 50 ml of water, 0.5 g of the purified powder was dispersed, and thereafter 15 g of an aqueous solution containing 20% by weight of polythiophenesulfonic acid (weight average molecular weight: 1,800) as the acid component was added. To the mixed solution, 1.5 g of ammonium persulfate as the oxidant (O3) was added and stirred at room temperature for 24 hours. The polythiophene suspension thus obtained was deep navy blue.

Figure 3:
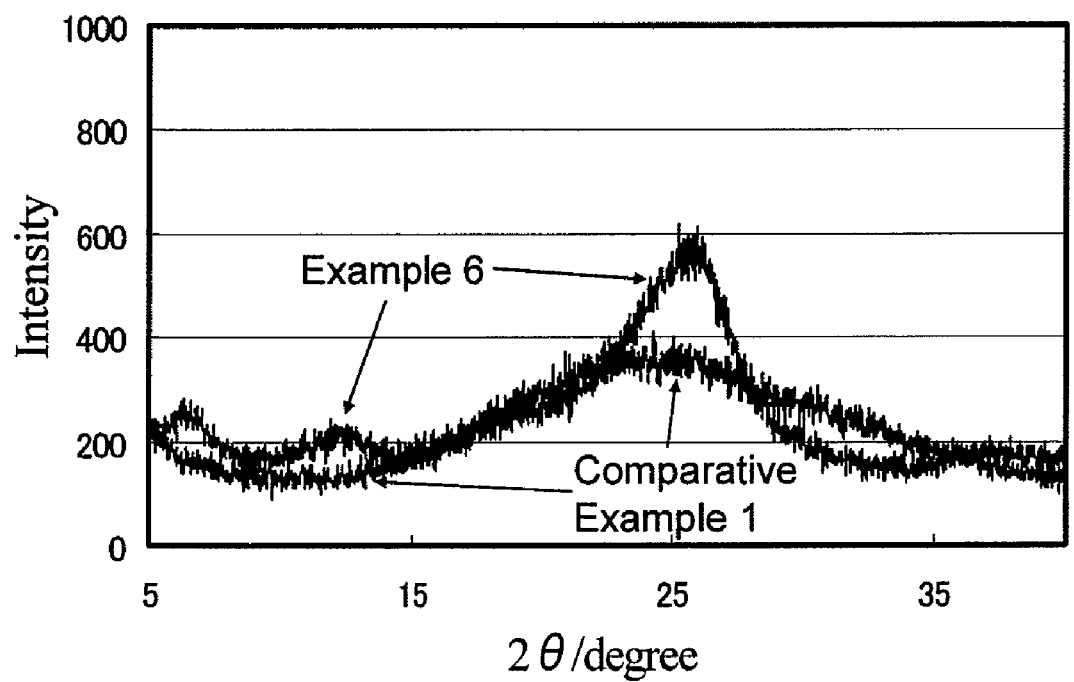

By using the obtained polythiophene suspension, a conductive polymer film was formed in the same manner as in Example 1, and thereafter the conductivity of the conductive polymer film was derived. The result thus obtained is shown in Table 1. Additionally, for the purpose of evaluating the crystallinity of the formed conductive polymer film, the X-ray diffraction of the conductive polymer film was measured, wherein the measurement was conducted by scanning the 2θ range from 5 to 40°. The measurement result thus obtained is shown in FIG. 3.

Example 7

Production Method (2)

A polythiophene suspension was produced by operating in the same manner as in Example 6 except that in the step (b) the obtained powder was washed with purified water and ethanol, and then further washed with boiling hot purified water. Then, a conductive polymer film was formed in the same manner as in Example 1, and thereafter the conductivity of the conductive polymer film was derived. The result thus obtained is shown in Table 1.

Example 8

Production Method (2)

A polythiophene suspension was produced by operating in the same manner as in Example 6 except that in the step (b) the obtained powder was washed with purified water and ethanol, and then further heat treated in a thermostatic chamber set at 125° C. Then, a conductive polymer film was formed in the same manner as in Example 1, and thereafter the conductivity of the conductive polymer film was derived. The result thus obtained is shown in Table 1.

Example 9

Production Method (2)

<Step (a)>
In 100 ml of water as the solvent, 1 g of 3,4-ethylenedioxythiophene as the monomer (M2) and 2.3 g of dodecylbenzenesulfonic acid functioning as the dopant (D2) and a surfactant were served. The reaction mixture was stirred at room temperature for 1 hour to be dispersed. Then, 2.4 g of ammonium persulfate as the oxidant (O2) was added to the reaction mixture, and the reaction mixture was further stirred at room temperature for 100 hours to conduct the chemical oxidative polymerization. In this case, the solution turned from yellow to deep blue.

<Step (b)>
From the obtained dispersion, a powder was collected by using a centrifugal separator (5,000 rpm). The powder was washed by decantation in the centrifugal separator by using purified water to remove the excessive oxidant (O2) and the excessive dopant (D2). The washing with purified water was repeated until the acidity of the supernatant liquid came to be pH 6 to 7.

A polythiophene suspension was produced by performing the step (c) in the same manner as in Example 6. Then, a conductive polymer film was formed in the same manner as in Example 1, and thereafter the conductivity of the conductive polymer film was derived. The result thus obtained is shown in Table 1.

Example 10

Production Method (2)

<Step (a)>>
In 100 ml of water as the solvent, 1 g of 3,4-ethylenedioxythiophene as the monomer (M2) and 1 g of camphorsulfonic acid as the dopant (D2) were dispersed by using 2 g of polyethylene glycol (weight average molecular weight: 4,000) functioning as a surfactant. The mixture thus obtained was stirred to be dispersed at room temperature for 1 hour, and then 2.4 g of ammonium persulfate as the oxidant (O2) was added to the obtained dispersion. The dispersion thus obtained was stirred at room temperature for 100 hours to conduct the chemical oxidative polymerization. In this case, the solution turned from yellow to deep blue.

A polythiophene suspension was produced by performing the step (b) and the step (c) in the same manner as in Example 6. Then, a conductive polymer film was formed in the same manner as in Example 1, and thereafter the conductivity of the conductive polymer film was derived. The result thus obtained is shown in Table 1.

Example 11

Production Method (2)

<Step (d)>
In 10 g of the polythiophene suspension obtained in Example 6, 1 g of erythritol was further dissolved at room temperature to produce a polythiophene suspension. Then, a conductive polymer film was formed in the same manner as in Example 1, and thereafter the conductivity of the conductive polymer film was derived. The result thus obtained is shown in Table 1.

Example 12

Production Method (2)

In 10 g of the polythiophene suspension obtained in Example 6, 1 g of pentaerythritol was further dissolved at room temperature to produce a polythiophene suspension. Then, a conductive polymer film was formed in the same manner as in Example 1, and thereafter the conductivity of the conductive polymer film was derived. The result thus obtained is shown in Table 1.

Example 13

Production Method (2)

In 10 g of the polythiophene suspension obtained in Example 6, 0.5 g of an acrylic resin solution was further mixed, and stirred at room temperature for 10 minutes to produce a polythiophene suspension. Then, a conductive polymer film was formed in the same manner as in Example 1, and thereafter the conductivity of the conductive polymer film was derived. The result thus obtained is shown in Table 1.

Example 14

Production Method (2)

In 20 g of the polythiophene suspension obtained in Example 6, 100 g of a commercially available amphoteric ion exchange resin in $H^+/OH^-$ form (manufactured by Organo Corp.) was served and stirred for 5 hours to produce a polythiophene suspension. In this case, the pH of the suspension was changed from 1.8 to 2.5. Then, a conductive polymer film was formed in the same manner as in Example 1, and thereafter the conductivity of the conductive polymer film was derived. The result thus obtained is shown in Table 1.

Example 15

A porous aluminum was used as the anode conductor consisting of a valve action metal and an oxide coating film to be a dielectric layer was formed on the surface of the aluminum by anodic oxidation. Next, the anode conductor with the dielectric layer formed thereon was immersed in and taken out from the polythiophene suspension produced in Example 1, then dried at 125° C., and thereafter treated at 180° C. for 30 minutes to form a solid electrolyte layer. On the solid electrolyte layer, a graphite layer and a silver-containing resin layer were formed in this order to yield a solid electrolytic capacitor.

The ESR (equivalent series resistance) of the obtained solid electrolytic capacitor was measured by using an LCR meter at a frequency of 100 kHz. The ESR value was normalized from the value corresponding to the total cathode area to the value corresponding to the unit area (1 cm$^2$). The result thus obtained is shown in Table 2.

Example 16

A porous aluminum was used as the anode conductor consisting of a valve action metal and an oxide coating film was formed on the surface of the aluminum metal by anodic oxidation. Next, the anode conductor with the dielectric layer formed thereon was immersed in and taken out from a monomer solution prepared by dissolving 10 g of pyrrole as the monomer (M3) in 200 ml of purified water and immersed in and taken out from an oxidant solution prepared by dissolving 20 g of p-toluenesulfonic acid as the dopant and 10 g of ammonium persulfate as the oxidant in 200 ml of purified water, in this order and repeatedly 10 times, to conduct the chemical oxidative polymerization, and thus the first solid electrolyte layer was formed.

The polythiophene suspension produced in Example 1 was dropped onto the first solid electrolyte layer, and dried and solidified at 125° C. to form the second solid electrolyte layer. On the second solid electrolyte layer, a graphite layer and a silver-containing resin layer were formed in this order to yield a solid electrolytic capacitor.

The ESR (equivalent series resistance) of the obtained solid electrolytic capacitor was measured in the same manner as in Example 15. The result thus obtained is shown in Table 2.

Example 17

A solid electrolytic capacitor was produced in the same manner as in Example 16 except that the polythiophene suspension produced in Example 6 was used, and the ESR (equivalent series resistance) of the solid electrolytic capacitor was measured. The result thus obtained is shown in Table 2.

Example 18

A solid electrolytic capacitor was produced in the same manner as in Example 16 except that the polythiophene suspension produced in Example 11 was used, and the ESR (equivalent series resistance) of the solid electrolytic capacitor was measured. The result thus obtained is shown in Table 2.

Example 19

A solid electrolytic capacitor was produced by operating in the same manner as in Example 16 except that porous tantalum was used as the anode conductor consisting of a valve action metal, and the ESR (equivalent series resistance) of the solid electrolytic capacitor was measured. The result thus obtained is shown in Table 2.

Comparative Example 1

In 20 ml of water, 2 g of polystyrenesulfonic acid (weight average molecular weight: 50,000), 0.5 g of 3,4-ethylenedioxythiophene and 0.05 g of iron(III) sulfate were served, and stirred at room temperature for 60 hours to produce a polythiophene solution. The particle size distribution of the obtained polythiophene solution was measured in the same manner as in Example 1. The measurement result thus obtained is shown in FIG. 2. Additionally, a conductive polymer film was formed in the same manner as in Example 1, and thereafter the conductivity of the conductive polymer film was derived. The result thus obtained is shown in Table 1. Further, for the purpose of evaluating the crystallinity of the formed conductive polymer film, the X-ray diffraction of the conductive polymer film was measured in the same manner as in Example 6. The measurement result thus obtained is shown in FIG. 3.

Comparative Example 2

A polythiophene solution was produced by operating in the same manner as in Comparative Example 1 except that a polystyrenesulfonic acid having a weight average molecular weight of 500,000 was used. The particle size distribution of the obtained polythiophene solution was measured in the same manner as in Example 1. The measurement result thus obtained is shown in FIG. 2. Additionally, a conductive polymer film was formed in the same manner as in Example 1, and thereafter the conductivity of the conductive polymer film was derived. The result thus obtained is shown in Table 1.

Comparative Example 3

A solid electrolytic capacitor was produced by operating in the same manner as in Example 16 except that the polythiophene solution produced in Comparative Example 1 was used, and the ESR (equivalent series resistance) of the solid electrolytic capacitor was measured. The result thus obtained is shown in Table 2.

TABLE 1

|  | Conductivity (S/cm) |
| --- | --- |
| Example 1 | 120 |
| Example 2 | 125 |
| Example 3 | 120 |
| Example 4 | 130 |
| Example 5 | 210 |
| Example 6 | 200 |
| Example 7 | 220 |
| Example 8 | 225 |
| Example 9 | 210 |
| Example 10 | 230 |
| Example 11 | 330 |
| Example 12 | 280 |
| Example 13 | 175 |
| Example 14 | 180 |
| Comparative Example 1 | 110 |
| Comparative Example 2 | 100 |

TABLE 2

|  | ESR (mΩ · cm$^2$) |
| --- | --- |
| Example 15 | 2.8 |
| Example 16 | 2.5 |
| Example 17 | 2.0 |
| Example 18 | 1.6 |
| Example 19 | 2.6 |
| Comparative Example 3 | 3.1 |

From the results of the particle size distribution measurement shown in FIG. 2, the particle size of the polythiophene suspension produced in Example 1 was verified to be smaller than the particle sizes of the polythiophene suspensions produced in Comparative Examples 1 and 2. There was found a tendency that the use of the smaller weight average molecular weight of the polystyrenesulfonic acid shift the particle size distribution of the polythiophene suspension to the smaller particle size.

As shown in Table 1, the conductive polymer films formed in Examples 1 to 14 were all higher in conductivity than the conductive polymer films formed in Comparative Examples 1 and 2. In particular, the conductive polymer films produced in Examples 6 to 14 were made remarkably higher in conductivity. In this way, by passing through the steps (a) to (c), (1) the choice of the dopant is made wider, (2) a dopant capable of enhancing the degree of crystallization can be selected, (3) a solvent composition having a high compatibility with the monomer can be selected to lead to a high degree of polymerization, and (4) washing is easily conducted and hence a high purity can be attained.

Additionally, in each of Examples 7 and 8 where poly(3,4-ethylenedioxythiophene) was washed with a hot water and/or heat treated in the step (b), the conductivity was found to be made higher. This is probably because the hot water used enabled the unnecessary components to be higher in solubility or the applied heating enabled the volatile components to be removed, and hence a further higher purity level was able to be attained.

Additionally, in each of Examples 5, 11 and 12 where erythritol or pentaerythritol was mixed, the conductivity was found to be made higher. This is probably because the interaction with the polystyrenesulfonic acid which is located in the vicinity of the particles of the poly(3,4-ethylenedioxythiophene) in the polythiophene suspension reduced the resistance between the particles of the poly(3,4-ethylenedioxythiophene) and at the same time increased the density of the poly(3,4-ethylenedioxythiophene). This effect provides, for example, an improvement so as to form a dense film when a conductive polymer layer is formed on a glass substrate.

From the measurement results of the X-ray diffraction shown in FIG. 3, it was able to be verified that the crystallinity of the conductive polymer film formed in Example 6 was higher than that of the conductive polymer film formed in Comparative Example 1. Consequently, the poly(3,4-ethylenedioxythiophene) in the obtained polythiophene suspension is satisfactory in the electron conduction between the polymer chains and hence comes to be highly conductive. It is to be noted that the conductive polymer film formed in Example 6 was high in the degree of crystallization so as to disperse light, and hence had no transparency to show a color close to black.

Additionally, as shown in Table 2, the solid electrolytic capacitors produced in Examples 15 to 19 were allowed to reduce the resistance of the solid electrolyte due to the high conductivity of the poly(3,4-ethylenedioxythiophene) and hence allowed to reduce the resistance (ESR) of the solid electrolytic capacitor.

It is to be noted that as can be seen from a comparison between Example 16 and Comparative Example 3, the resistance values of the capacitors are largely different although the conductivities of the conductive polymers used are slightly different. This is probably because the polythiophene suspension used in Example 16 has a smaller particle size, hence is easily penetrated into the interior of the porous body so as to increase the contact portion with the internal polymer, and thus the effect of the thus reduced contact resistance was manifested.

What is claimed is:

1. A method for producing a conductive polymer suspension, comprising:
synthesizing a conductive polymer (P1) by chemical oxidative polymerization of a monomer (M1) giving the conductive polymer by using an oxidant (O1) in an aqueous solvent containing a dopant (D1) consisting of a low-molecular organic acid or a salt thereof, or a polyacid having a weight average molecular weight of less than 2,000 or a salt thereof and
mixing said conductive polymer with erythritol and/or pentaerythritol.

2. The method for producing a conductive polymer suspension according to claim 1, wherein the monomer (M1) is at least one selected from pyrrole, thiophene, aniline and derivatives of these.

3. The method for producing a conductive polymer suspension according to claim 2, wherein the monomer (M1) is 3,4-ethylenedioxythiophene.

4. The method for producing a conductive polymer suspension according to claim 1, wherein the dopant (D1) is styrenesulfonic acid or a polystyrenesulfonic acid having a weight average molecular weight of less than 2,000.

5. The method for producing a conductive polymer suspension according to claim 1, conducted in the presence of a surfactant.

6. A conductive polymer suspension obtained by the method according to claim 1.

7. A conductive polymer material obtained by removing the solvent from the conductive polymer suspension according to claim 6.

8. A solid electrolytic capacitor comprising a solid electrolyte layer including the conductive polymer material according to claim 7.

9. The solid electrolytic capacitor according to claim 8, comprising an anode conductor consisting of a valve action metal and a dielectric layer formed on the surface of the anode conductor, wherein the solid electrolyte layer is formed on the dielectric layer.

10. The solid electrolytic capacitor according to claim 9, wherein the valve action metal is at least one selected from aluminum, tantalum and niobium.

11. An electrolytic capacitor comprising as an electrolyte the conductive polymer suspension according to claim 6.

12. A method for producing a solid electrolytic capacitor, comprising:
forming a dielectric layer on the surface of an anode conductor consisting of a valve action metal; and
forming a solid electrolyte layer comprising the conductive polymer material by applying or impregnating the conductive polymer suspension according to claim 6 onto the dielectric layer and by removing the solvent from the conductive polymer suspension.

13. The method for producing a solid electrolytic capacitor according to claim 12, wherein the valve action metal is at least one selected from aluminum, tantalum and niobium.

14. A method for producing a solid electrolytic capacitor, comprising:
forming a dielectric layer on the surface of an anode conductor consisting of a valve action metal;
forming a first solid electrolyte layer comprising a conductive polymer (P3) by chemical oxidative polymerization or electrolytic polymerization of a monomer (M3) giving the conductive polymer on the dielectric layer; and
forming a second solid electrolyte layer by applying or impregnating the conductive polymer suspension according to claim 6 onto the first solid electrolyte layer and by removing the solvent from the conductive polymer suspension.

15. The method for producing a solid electrolytic capacitor according to claim 14, wherein the conductive polymer (P3) is a polymer obtained by chemical oxidative polymerization or electrolytic polymerization of at least one selected as the monomer (M3) from pyrrole, thiophene, aniline and derivatives of these.

16. The method for producing a solid electrolytic capacitor according to claim 14, wherein the valve action metal is at least one selected from aluminum, tantalum and niobium.

17. A method for producing a conductive polymer suspension, comprising:
- (a) synthesizing the conductive polymer (P2) by chemical oxidative polymerization of a monomer (M2) giving the conductive polymer by using an oxidant (O2) in a solvent containing a dopant (D2) consisting of a low-molecular organic acid or a salt thereof;
- (b) purifying the conductive polymer (P2); and
- (c) mixing the purified conductive polymer (P2) and an oxidant (O3) in an aqueous solvent containing a polyacid component consisting of a low-molecular organic acid or a salt thereof, or a polyacid having a weight average molecular weight of less than 2,000 or a salt thereof, to obtain the conductive polymer suspension.

18. The method for producing a conductive polymer suspension according to claim 17, wherein the monomer (M2) is at least one selected from pyrrole, thiophene, aniline and derivatives of these.

19. The method for producing a conductive polymer suspension according to claim 18, wherein the monomer (M2) is 3,4-ethylenedioxythiophene.

20. The method for producing a conductive polymer suspension according to claim 17, wherein the dopant (D2) is at least one selected from benzenesulfonic acid, naphthalenesulfonic acid, camphorsulfonic acid and derivatives of these, and salts of these.

21. The method for producing a conductive polymer suspension according to claim 17, wherein the step (a) is conducted in the presence of a surfactant.

22. The method for producing a conductive polymer suspension according to claim 17, wherein in the step (b) the conductive polymer (P2) is washed by using a solvent capable of dissolving the monomer (M2) and/or the oxidant (O2).

23. The method for producing a conductive polymer suspension according to claim 22, wherein in the step (b) the conductive polymer (P2) is further washed with a hot water and/or heat treated.

24. The method for producing a conductive polymer suspension according to claim 17, wherein the acid component is styrenesulfonic acid or a polystyrenesulfonic acid having a weight average molecular weight of less than 2,000.

25. The method for producing a conductive polymer suspension according to claim 17, the method further comprising:
- (d) mixing at least one selected from erythritol and pentaerythritol.

26. A conductive polymer suspension obtained by the method according to claim 17.

27. A conductive polymer material obtained by removing the solvent from the conductive polymer suspension according to claim 26.

28. A solid electrolytic capacitor comprising a solid electrolyte layer including the conductive polymer material according to claim 27.

29. The solid electrolytic capacitor according to claim 28, comprising an anode conductor consisting of a valve action metal and a dielectric layer formed on the surface of the anode conductor, wherein the solid electrolyte layer is formed on the dielectric layer.

30. The solid electrolytic capacitor according to claim 29, wherein the valve action metal is at least one selected from aluminum, tantalum and niobium.

31. An electrolytic capacitor comprising as an electrolyte the conductive polymer suspension according to claim 26.

32. A method for producing a solid electrolytic capacitor, comprising:
- forming a dielectric layer on the surface of an anode conductor consisting of a valve action metal; and
- forming a solid electrolyte layer comprising the conductive polymer material by applying or impregnating the conductive polymer suspension according to claim 26 onto the dielectric layer and by removing the solvent from the conductive polymer suspension.

33. The method for producing a solid electrolytic capacitor according to claim 32, wherein the valve action metal is at least one selected from aluminum, tantalum and niobium.

34. A method for producing a solid electrolytic capacitor, comprising:
- forming a dielectric layer on the surface of an anode conductor consisting of a valve action metal;
- forming a first solid electrolyte layer comprising a conductive polymer (P3) by chemical oxidative polymerization or electrolytic polymerization of a monomer (M3) giving the conductive polymer on the dielectric layer; and
- forming a second solid electrolyte layer by applying or impregnating the conductive polymer suspension according to claim 26 onto the first solid electrolyte layer and by removing the solvent from the conductive polymer suspension.

35. The method for producing a solid electrolytic capacitor according to claim 34, wherein the conductive polymer (P3) is a polymer obtained by chemical oxidative polymerization or electrolytic polymerization of at least one selected as the monomer (M3) from pyrrole, thiophene, aniline and derivatives of these.

36. The method for producing a solid electrolytic capacitor according to claim 34, wherein the valve action metal is at least one selected from aluminum, tantalum and niobium.

* * * * *